(12) United States Patent
Wei et al.

(10) Patent No.: US 8,704,966 B2
(45) Date of Patent: Apr. 22, 2014

(54) PIXEL ARRAY, ACTIVE DEVICE ARRAY SUBSTRATE AND FLAT DISPLAY PANEL

(75) Inventors: Chuan-Sheng Wei, Taichung (TW); Ming-Tao Chiang, Hsinchu (TW); Yu-Ting Lin, New Taipei (TW); Maw-Song Chen, Taipei (TW); Wei-Ming Huang, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 197 days.

(21) Appl. No.: 13/300,674

(22) Filed: Nov. 21, 2011

(65) Prior Publication Data

US 2013/0010247 A1    Jan. 10, 2013

(30) Foreign Application Priority Data

Jul. 6, 2011    (TW) .............................. 100123889 A

(51) Int. Cl.
*G02F 1/136* (2006.01)
(52) U.S. Cl.
USPC ......................................................... 349/43
(58) Field of Classification Search
USPC ......................................................... 349/43
See application file for complete search history.

(56) References Cited

U.S. PATENT DOCUMENTS

| 6,028,580 A | 2/2000 | Kosegawa et al. |
| 6,627,957 B1 | 9/2003 | Yamazaki |
| 2012/0224128 A1* | 9/2012 | Jung et al. ..................... 349/129 |

FOREIGN PATENT DOCUMENTS

| CN | 101504503 A | 8/2009 |
| CN | 101859048 A | 10/2010 |
| TW | 595005 | 6/2004 |

* cited by examiner

*Primary Examiner* — Timothy L Rude
(74) *Attorney, Agent, or Firm* — Jiang Chyun IP Office

(57) ABSTRACT

A pixel array including a pixel electrode and an active device is provided. The active device includes a gate, a channel layer, a source, a drain, a connection electrode, a first branch portion and a second branch portion. The gate is electrically connected with a scan line. The channel layer located at a side of the gate is electrically isolated from the gate. The source, the drain and the connection electrode are disposed on a part region of the channel layer. The first branch portion disposed on a part region of the channel layer is connected with an end of the connection electrode. The first branch portion surrounds the source located on the channel layer. The second branch portion disposed on a part region of the channel layer is connected with the other end of the connection electrode. The second branch portion surrounds the drain located on the channel layer.

21 Claims, 8 Drawing Sheets

PIXEL ARRAY, ACTIVE DEVICE ARRAY SUBSTRATE AND FLAT DISPLAY PANEL

CROSS-REFERENCE TO RELATED APPLICATION

This application claims the priority benefit of Taiwan application serial no. 100123889, filed on Jul. 6, 2011. The entirety of the above-mentioned patent application is hereby incorporated by reference herein and made a part of this specification.

BACKGROUND OF THE INVENTION

1. Field of the Invention

The invention relates to a pixel structure, an active device array substrate having the pixel structure, and a flat display panel.

2. Description of Related Art

With increasing progress towards display technologies, displays facilitate our daily lives, and the requirements for light and compact displays contribute to development of flat panel displays (FPDs) as the mainstream displays at this current stage. In general, each pixel structure in an FPD includes an active device and a pixel electrode, and the active device serves as a switch element of a display unit. To control each individual pixel structure, a certain pixel is usually selected by a corresponding scan line and a corresponding data line, and display data corresponding to the certain pixel are displayed through providing an appropriate operating voltage. The pixel structure further includes a storage capacitor that stores the afore-mentioned operating voltage, such that the pixel structure can retain the voltage in order to stabilize the display images.

Devices in the FPD operated under a high voltage may have increasing current leakage, and therefore two thin film transistors (TFTs) are often connected in series, so as to reduce the current leakage.

FIG. 1 is a schematic view illustrating circuits of two serially-connected TFTs in a conventional pixel structure. The conventional pixel structure P includes a first thin film transistor TFT1, a second thin film transistor TFT2, a storage capacitor Cst, and a display capacitor (e.g., an electrophoretic capacitor or a liquid crystal capacitor $C_{LC}$). Here, the first thin film transistor TFT1 and the second thin film transistor TFT2 are serially connected to each other. The gate electrode of the first thin film transistor TFT1 and the gate electrode of the second thin film transistor TFT2 are electrically connected to the same scan line SL, and the first thin film transistor TFT1 is electrically connected to the data line DL. The second thin film transistor TFT2 is electrically connected to the storage capacitor Cst and the liquid crystal capacitor $C_{LC}$.

As mentioned above, the devices in the FPD operated under a high voltage may have increasing current leakage. In order to reduce the current leakage, the layout area of the common electrode in the pixel structure is often expanded to increase the storage capacitance of the storage capacitor Cst. However, to ensure satisfactory electrical performance of the pixel structure P (e.g., to reduce the current leakage and increase the conductive current), the layout design of two serially-connected TFTs needs to be applied in the pixel structure P. The increasing number of TFTs leads to reduction of the usable area of the storage capacitor Cst, and thus the storage capacitance of the storage capacitor Cst cannot be increased. On the other hand, if the layout area of the first thin film transistor TFT1 and the second thin film transistor TFT2 are reduced and the layout area of the common electrode is expanded for increasing the storage capacitance of the storage capacitor Cst, the electrical performance of the devices may be deteriorated. For instance, the process shift between the gate electrode and the source electrode and drain electrode results in the change of parasitic capacitance, and thus the display images may flicker. Accordingly, how to expand the layout area of the storage capacitor Cst and maintain satisfactory performance of devices is one of the issues to be resolved immediately.

SUMMARY OF THE INVENTION

The invention is directed to a pixel structure, an active device array substrate having the pixel structure, and a flat display panel. In the invention, satisfactory performance of a storage capacitor Cst and other devices can be ensured, and the quality of the display images can be improved.

In an embodiment of the invention, a pixel structure electrically connected to a scan line and a data line is provided. The pixel structure includes a pixel electrode and an active device. The active device includes a gate electrode, a channel layer, a source electrode, a drain electrode, a connection electrode, a first branch portion, and a second branch portion. The gate electrode is electrically connected to the scan line. The channel layer is located at a side of the gate electrode and electrically insulated from the gate electrode. The source electrode is electrically connected to the data line. The drain electrode is electrically connected to the pixel electrode. The source electrode, the drain electrode, and the connection electrode are located on a portion of the channel layer, and the connection electrode is located between the source electrode and the drain electrode. The first branch portion is located on a portion of the channel layer, is connected to an end of the connection electrode, and surrounds the source electrode on the channel layer. The second branch portion is located on a portion of the channel layer, is connected to the other end of the connection electrode, and surrounds the drain electrode on the channel layer.

According to an embodiment of the invention, the pixel electrode includes a reflective electrode, a transmissive electrode, or a transflective electrode.

According to an embodiment of the invention, the pixel structure further includes a gate dielectric layer that is located between the gate electrode and the channel layer.

According to an embodiment of the invention, the channel layer includes a first channel pattern layer and a second channel pattern layer, the source electrode, the connection electrode, and the first branch portion are respectively located on a portion of the first channel pattern layer, and the drain electrode, the connection electrode, and the second branch portion are respectively located on a portion of the second channel pattern layer.

According to an embodiment of the invention, the gate electrode, the first channel pattern layer, the source electrode, the connection electrode, and the first branch portion together constitute a first TFT, and the gate electrode, the second channel pattern layer, the drain electrode, the connection electrode, and the second branch portion together constitute a second TFT.

According to an embodiment of the invention, the connection electrode and the first branch portion collectively have a U shaped pattern.

According to an embodiment of the invention, the connection electrode and the second branch portion collectively have a U shaped pattern.

According to an embodiment of the invention, the connection electrode, the first branch portion, and the second branch portion collectively have an S shaped pattern.

According to an embodiment of the invention, the connection electrode, the first branch portion, and the second branch portion collectively have an X shaped pattern.

According to an embodiment of the invention, extension directions of the source electrode, the drain electrode, and the connection electrode are substantially the same.

According to an embodiment of the invention, extension directions of the source electrode, the drain electrode, and the connection electrode are substantially parallel to a direction of the scan line.

According to an embodiment of the invention, the pixel structure further includes a common electrode that is configured below the pixel electrode.

According to an embodiment of the invention, the gate electrode is a segment of the scan line.

According to an embodiment of the invention, extension directions of the source electrode, the drain electrode, and the connection electrode are substantially parallel to a direction of the data line.

According to an embodiment of the invention, the channel layer has a continuous pattern.

According to an embodiment of the invention, the channel layer includes a first channel portion and a second channel portion, the source electrode, the connection electrode, and the first branch portion are respectively located on a portion of the first channel portion, and the drain electrode, the connection electrode, and the second branch portion are respectively located on a portion of the second channel portion.

The invention is further directed to an active device array substrate that includes a substrate, a plurality of scan lines, a plurality of data lines, and the pixel structures. The scan lines are configured on the substrate in parallel. The data lines are configured on the substrate in parallel and intersect the scan lines. The pixel structures are located on the substrate, and each of the pixel structures is electrically connected to a corresponding one of the data lines and a corresponding one of the scan lines.

The invention is further directed to a flat display panel that includes a first substrate, a second substrate, a display medium, a plurality of scan lines, a plurality of data lines, and the pixel structures. The display medium is located between the first substrate and the second substrate. The scan lines are configured on the first substrate in parallel. The data lines are configured on the first substrate in parallel and intersect the scan lines. The pixel structures are located on the first substrate, and each of the pixel structures is electrically connected to a corresponding one of the data lines and a corresponding one of the scan lines.

According to an embodiment of the invention, the display medium includes a liquid crystal layer, an electro-phoretic display film, or an organic electro-luminescent layer.

According to an embodiment of the invention, the electro-phoretic display film includes a microcapsule electro-phoretic display film or a microcup electro-phoretic display film.

According to an embodiment of the invention, the second substrate further includes an opposite electrode.

Based on the above, the connection electrode, the first branch portion, and the second branch portion are located in the pixel structure according to the embodiments of the invention. Specifically, the first branch portion surrounds the source electrode, and the second branch portion surrounds the drain electrode. Thereby, the layout area of the active device can be reduced when the width-to-length (W/L) ratio of the channel remains high. As the layout area of the active device is reduced, the layout area of the common electrode can be expanded, and thus the storage capacitance of the storage capacitor Cst can be significantly increased. In addition, the design of two serially-connected, symmetric gate electrodes (i.e., the dual-gate design) applied in the pixel structure as described in the embodiments of the invention can reduce the asymmetric gate-to-drain capacitance Cgd caused by PEP shift, and thereby the display quality of the images can be improved.

In order to make the aforementioned and other features and advantages of the invention more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
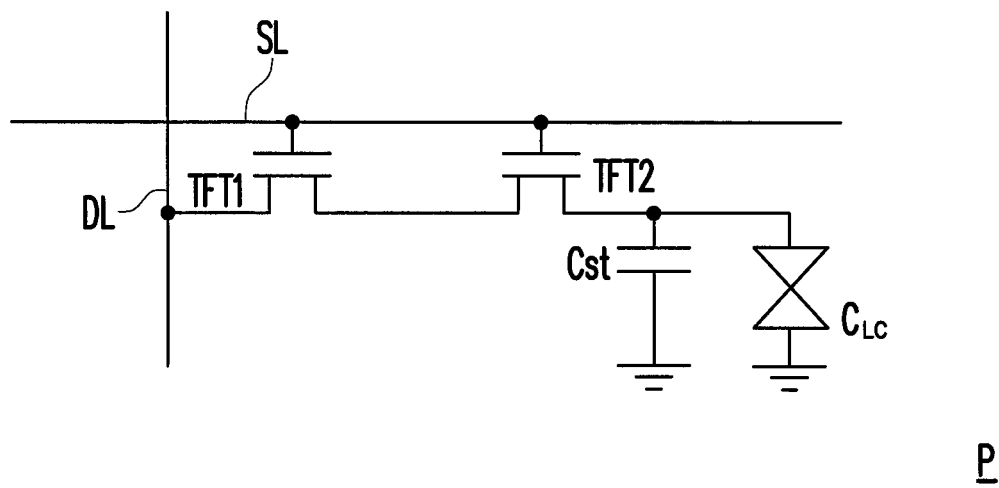
FIG. 1 is a schematic diagram illustrating circuits in a conventional pixel structure.
Figure 2:
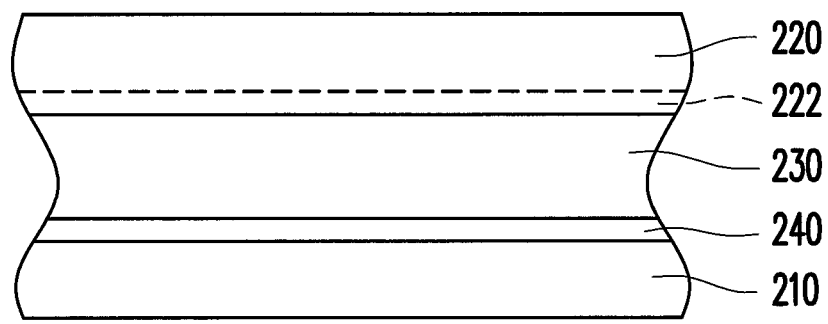
FIG. 2 is a schematic cross-sectional view illustrating a flat display panel according to an embodiment of the invention.

FIG. 2 is a schematic cross-sectional view illustrating a flat display panel according to an embodiment of the invention. With reference to FIG. 2, the flat display panel includes a first substrate 210, a second substrate 220, a display medium 230, and an active device array 240. The second substrate 220 is located above the first substrate 210. Here, the second substrate 220 can be a simple blank substrate or a substrate that includes an opposite electrode 222. The display medium 230 is located between the first substrate 210 and the second substrate 220. The display medium 230 is an electro-phoretic display film, an organic electroluminescent layer, or a liquid crystal layer, for instance, and the electro-phoretic display film can be a microcup electro-phoretic display film or a microcapsule electro-phoretic display film. This is well known to people having ordinary skill in the art, and thus no further description is given below. The active device array 240 is configured on the first substrate 210, and the active device array 240 and the first substrate 210 together constitute the active device array substrate. Specifically, the active device array 240 includes a plurality of scan lines, a plurality of data lines, and a plurality of pixel structures which are all located on the first substrate 210. Each of the pixel structures is electrically connected to a corresponding one of the scan lines and a corresponding one of the data lines.

Figure 3A:
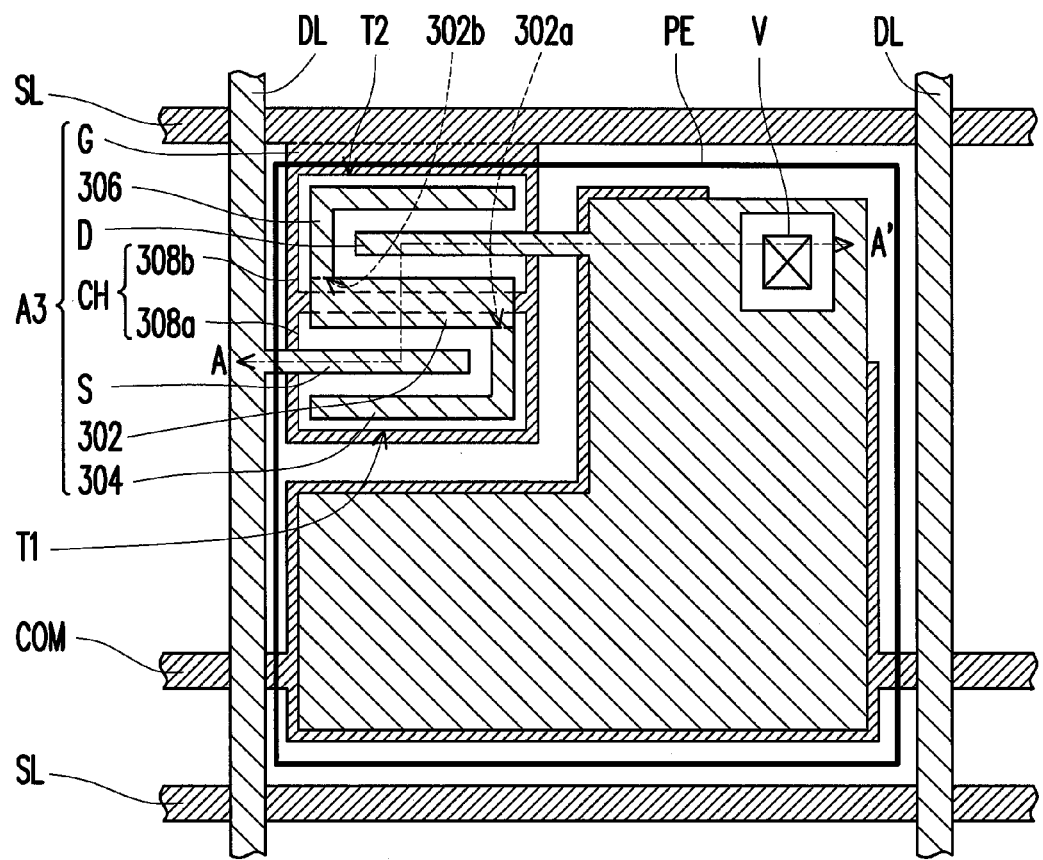
FIG. 3A is a schematic top view illustrating a pixel structure according to an embodiment of the invention.
Figure 3B:
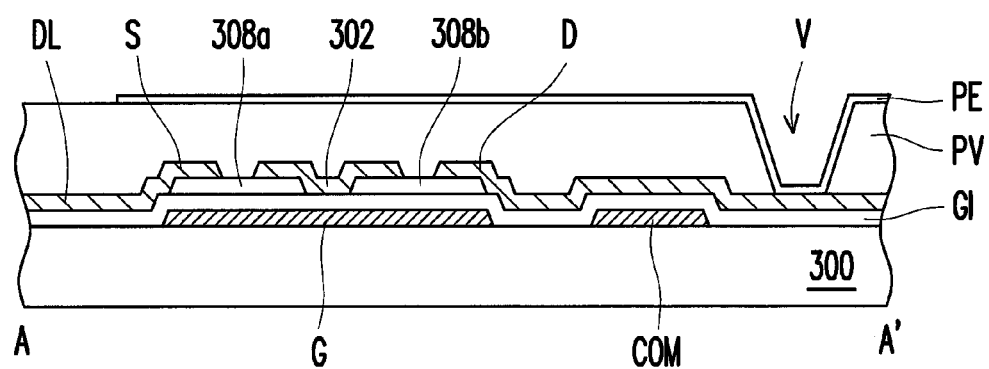
FIG. 3B is a schematic cross-sectional view taken along a line segment A-A' depicted in FIG. 3A.

The embodiments of the invention are further described with reference to top views provided below. Note that the following embodiments serve to elaborate the relative configuration of the scan lines, the data lines, and the pixel structures in the active device array, such that people having ordinary skill in the art can embody the invention. However, the invention should not be construed as limited to these embodiments. FIG. 3A is a schematic top view illustrating a pixel structure according to an embodiment of the invention. FIG. 3B is a schematic cross-sectional view taken along a line segment A-A' depicted in FIG. 3A.

As indicated in FIG. 3A and FIG. 3B, a plurality of scan lines SL are configured on the first substrate 300 in parallel, and a plurality of data lines DL are configured on the first substrate 300 in parallel. Here, the data lines DL intersect the scan lines SL. That is to say, extension directions of the data lines DL are not parallel to extension directions of the scan lines SL. Preferably, the extension directions of the data lines DL are perpendicular to the extension directions of the scan lines SL. In addition, the scan lines SL and the data lines DL are in different layers. In consideration of electrical conductivity, the scan lines SL and the data lines DL are normally made of metallic materials. However, the invention is not limited thereto. According to other embodiments, the scan lines SL and the data lines DL can also be made of other conductive materials.

The pixel structures of this embodiment are located on the first substrate 300, and each of the pixel structures is electrically connected to the corresponding scan line SL and the corresponding data line DL. Each of the pixel structures includes an active device A3 and a pixel electrode PE that is electrically connected to the active device A3. The active device A3 includes a gate electrode G, a channel layer CH, a source electrode S, a drain electrode D, a connection electrode 302, a first branch portion 304, and a second branch portion 306.

The gate electrode G is located on the first substrate 300. The gate electrode G is electrically connected to the scan line SL. Besides, the gate electrode G and the scan line SL are in the same layer, for instance, and the gate electrode G and the scan line SL are made of the same or similar material. According to an embodiment of the invention, the gate electrode G is, for instance, a segment of the scan line SL, as shown in FIG. 3A. In other words, the scan line SL has a segment with a relatively large width, and the segment may extend to the pixel structure and serve as the gate electrode G. Hence, the gate electrode G and the scan line SL can be integrally formed.

The channel layer CH can be located above the gate electrode G. Besides, the channel layer CH is located at a side of the gate electrode G and electrically insulated from the gate electrode G. Here, the channel layer CH is made of amorphous silicon, polysilicon, a metal oxide semiconductor, or any other semiconductor material, for instance. As indicated in FIG. 3B, the pixel structure in an embodiment of the invention further includes a gate electrode dielectric layer GI that is located between the gate electrode G and the channel layer CH, such that the channel layer CH is electrically insulated from the gate electrode G. The gate dielectric layer GI includes silicon oxide, silicon nitride, SiON, or any other appropriate dielectric material.

The source electrode S, the drain electrode D, and the connection electrode 302 can be located on a portion of the channel layer CH. The source electrode S is electrically connected to the data line DL. The drain electrode D is electrically connected to the pixel electrode PE. The connection electrode 302 is located between the source electrode S and the drain electrode D. In an embodiment of the invention, the extension directions of the source electrode S, the drain electrode D, and the connection electrode 302 are substantially the same. For instance, the extension directions of the source electrode S, the drain electrode D, and the connection electrode 302 are substantially parallel to a direction of the scan line SL.

The first branch portion 304 is located on a portion of the channel layer CH and connected to one end 302a of the connection electrode 302. In an embodiment of the invention, the connection electrode 302 and the first branch portion 304 are collectively shaped as a letter U. Therefore, the connection electrode 302 and the first branch portion 304 together surround the source electrode S that is located on the channel layer CH.

The second branch portion 306 is located on a portion of the channel layer CH and connected to the other end 302b of the connection electrode 302. In an embodiment of the invention, the connection electrode 302 and the second branch portion 306 are collectively shaped as a letter U. Therefore, the connection electrode 302 and the second branch portion 306 together surround the drain electrode D that is located on the channel layer CH. As indicated in FIG. 3A, the connection electrode 302, the first branch portion 304, and the second branch portion 306 are collectively shaped as a letter S. The opening of the U-shaped pattern constituted by the connection electrode 302 and the first branch portion 304 and the opening of the U-shaped pattern constituted by the connection electrode 302 and the second branch portion 306 respectively face two opposite sides.

In this embodiment, the source electrode S, the drain electrode D, the connection electrode 302, the first branch portion 304, the second branch portion 306, and the data lines DL are in the same layer and made of the same or similar material, for instance. Besides, the connection electrode 302, the first branch portion 304, and the second branch portion 306 are integrally formed, for instance.

In this embodiment, the channel layer CH includes a first channel pattern layer 308a and a second channel pattern layer 308b. The source electrode S, the connection electrode 302, and the first branch portion 304 are respectively located on a portion of the first channel pattern layer 308a, and the drain electrode D, the connection electrode 302, and the second branch 306 are respectively located on a portion of the second channel pattern layer 308b. That is to say, the connection electrode 302 stretches across a portion of the first and second channel pattern layers 308a and 308b, for instance. As such, the gate electrode G, the first channel pattern layer 308a, the source electrode S, the connection electrode 302, and the first branch portion 304 together constitute the first TFT T1. Here, the connection electrode 302 and the first branch portion 304 serve as the drain electrode of the first TFT T1; the gate electrode G, the second channel pattern layer 308b, the drain electrode D, the connection electrode 302, and the second branch portion 306 together constitute the second TFT T2. The connection portion 302 and the second branch portion 306 serve as the source electrode of the second TFT T2. The first and second TFTs T1 and T2 described in the embodiment of the invention has the bottom-gate structure, for instance, while the first and second TFTs T1 and T2 in other embodiments of the invention can be top-gate TFTs, coplanar TFTs, or other appropriate TFTs.

The pixel electrode PE is located above the active device A3. A passivation layer PV can be configured between the pixel electrode PE and the active device A3. The passivation layer PV has a contact opening V, such that the pixel electrode PE is electrically connected to the drain electrode D of the active device A3 through the contact opening V. The pixel electrode PE can be a reflective electrode, a transmissive electrode, or a transflective electrode. The reflective electrode is made of a metallic material that is characterized by high reflectivity, for instance. A material of the transmissive electrode includes metal oxide, such as indium tin oxide (ITO), indium zinc oxide (IZO), aluminum tin oxide (ATO), aluminum zinc oxide (AZO), indium germanium zinc oxide, other suitable oxide, or a stacked layer having at least two of the above materials. The passivation layer PV can have a single-layer or multi-layer structure and can be made of silicon oxide, silicon nitride, SiON, or any other appropriate dielectric material, for instance.

In an embodiment of the invention, the pixel structure further includes a common electrode COM that is located below the pixel electrode PE. The common electrode COM and the gate electrode G of the active device A3 are formed by patterning the same layer, for instance, and the common electrode COM is separated from the gate electrode G. The common electrode COM is substantially located below a portion of the drain electrode D, and a storage capacitor Cst of the pixel structure is formed at the overlapping portion of the common electrode COM and the drain electrode D, so as to ensure the favorable display quality. Particularly, the common electrode COM acts as the lower electrode of the storage capacitor Cst, and the drain electrode D acts as the upper electrode of the storage capacitor Cst. The gate dielectric layer GI that serves as the capacitance dielectric layer is configured between the lower electrode and the upper electrode, and the upper electrode and the lower electrode are coupled to form the storage capacitor Cst that has the metal layer/insulation layer/metal layer (MIM) structure.

As shown in FIG. 3A, the connection electrode 302 and the first branch portion 304 in the first TFT T1 of the pixel structure are collectively shaped as a letter U, and the U-shaped pattern surrounds the source electrode S. Therefore, the layout area can be reduced while the width-to-length (W/L) ratio of the channel can remain high. Similarly, the connection electrode 302 and the second branch portion 306 in the second TFT T2 of the pixel structure are collectively shaped as a letter U, and the U-shaped pattern surrounds the drain electrode D. Therefore, the layout area can also be reduced while the W/L ratio of the channel can remain high. To be more specific, since the connection electrode 302, the first branch portion 304, and the second branch portion 306 are collectively shaped as a letter S, the layout area of the active device A3 can thereby be reduced, and the layout area of the common electrode COM can be expanded. As such, the overlapping portion of the common electrode COM and the drain electrode D is enlarged, which can significantly increase the storage capacitance of the storage capacitor Cst. Namely, as described in the above embodiment, the design of the S-shaped pattern applied in the pixel structure also contributes to the reduction of the layout area of the active device A3 while the W/L ratio of the channel stays unchanged. Even though the layout area of the active device A3 in the pixel structure of this embodiment is reduced, as compared with the conventional pixel structure, the conductive current Ion is not decreased, and thus favorable performance of the devices can be guaranteed.

Note that the design of two serially-connected gate electrodes (i.e., the dual-gate design) is applied to the first and second TFTs T1 and T2, which not only results in the significant current output but also reduces the current leakage when the flat display panel is operated under a high voltage. Moreover, the design of two symmetric S-shaped gate electrodes is applied in the pixel structure, and the first and second TFTs T1 and T2 share the gate electrode G. Hence, the process tolerance can be effectively improved. Namely, in the invention, the PEP shift in the manufacturing process barely causes the asymmetric gate-to-drain capacitance Cgd, and thus the feed-through voltage difference resulting from the asymmetric gate-to-drain capacitance Cgd can be prevented. As a result, display images are less likely to flicker, and the image quality can be improved.

Figure 4:
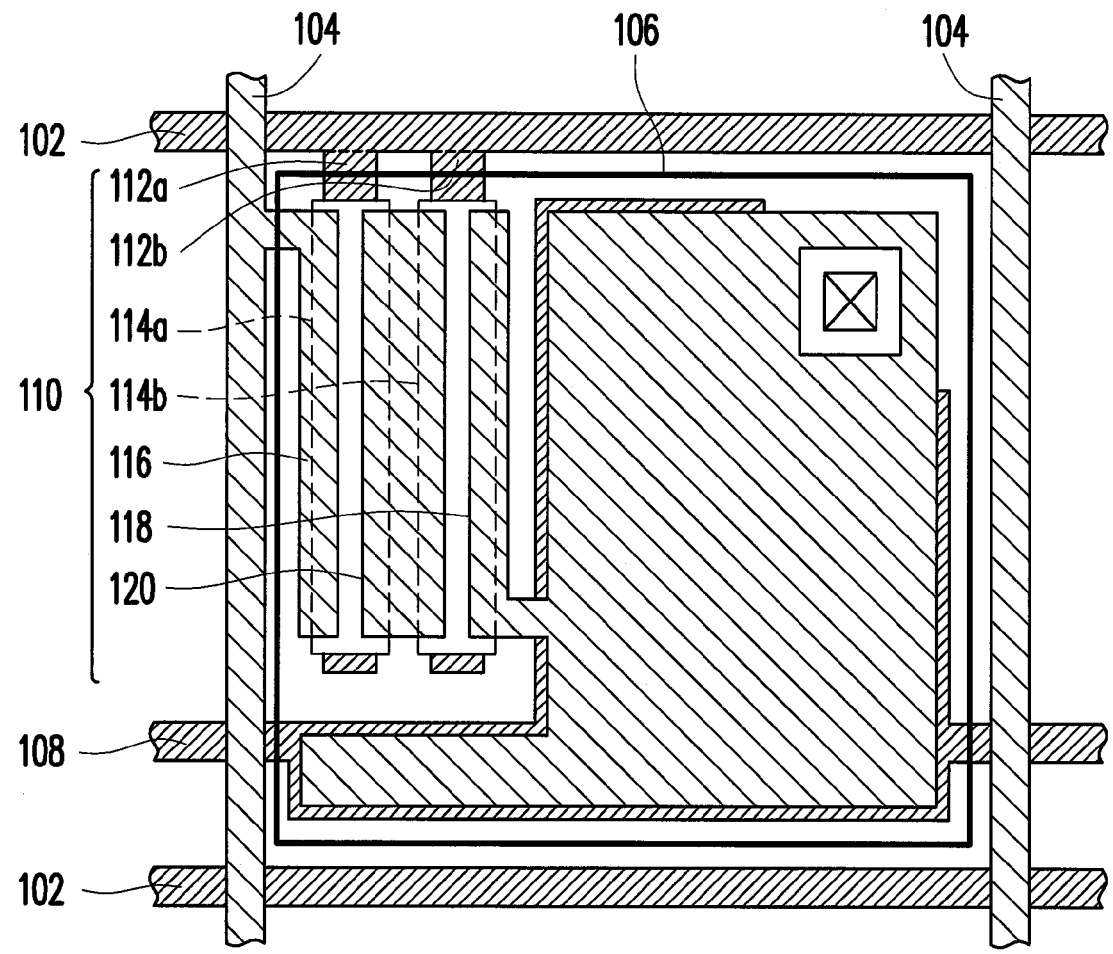
FIG. 4 is a schematic top view illustrating a pixel structure according to a comparison embodiment of the invention.

FIG. 4 is a schematic top view illustrating a pixel structure according to a comparison embodiment of the invention. Each of the pixel structures is electrically connected to a corresponding one of the scan lines 102 and a corresponding one of the data lines 104 and includes a pixel electrode 106, a common electrode 108, and an active device 110. The active device 110 includes gate electrodes 112a and 112b, channel layers 114a and 114b, a source electrode 116, a drain electrode 118, and a connection electrode 120. As indicated in FIG. 4, extension directions of the two gate electrodes 112a and 112b are substantially parallel to extension directions of the data lines 104. Extension directions of the source electrode 116, the drain electrode 118, and the connection electrode 120 on a portion of the channel layers 114a and 114b are substantially parallel to the extension directions of the gate electrodes 112a and 112b (i.e., the extension directions of the data lines 104). Besides, the connection electrode 120 neither surrounds the source electrode 116 nor surrounds the drain electrode 118.

Figure 10:
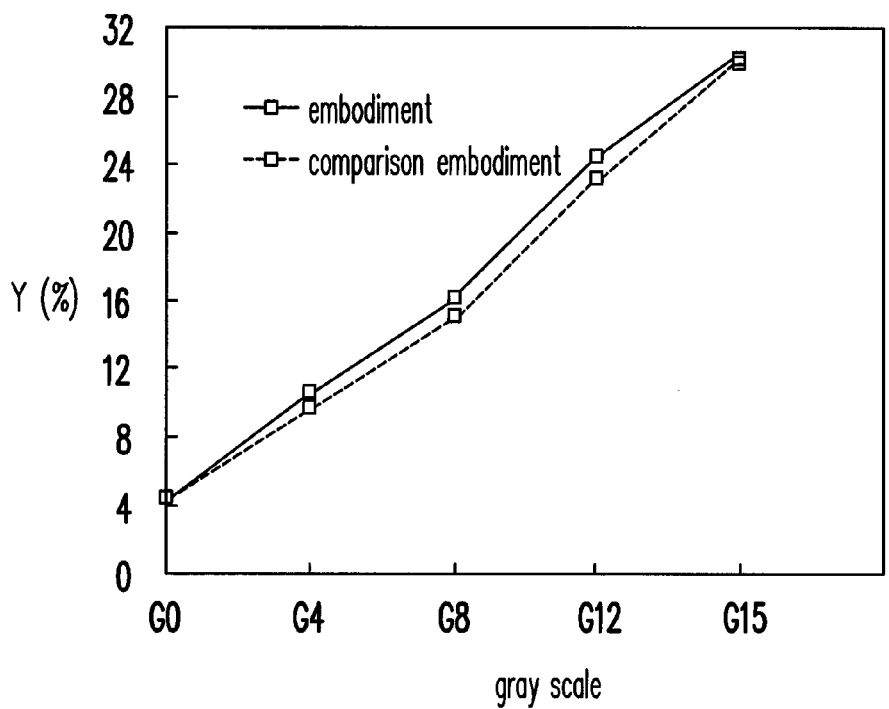
FIG. 10 is a graph illustrating the gray-scale and whiteness correlation according to an embodiment and a comparison embodiment of the invention.

In the pixel structure described in the comparison example and shown in FIG. 4, approximately 25% of Ion loss may be caused by PEP shift. By contrast, in the pixel structure shown in FIG. 3A, there is no Ion loss issue, and thus the gamma curve and the gray-scale display quality are relatively favorable. In the electro-phoretic display shown in FIG. 10, when the same gray-scale value is given, whiteness (Y %) of the display images is relatively satisfactory in the embodiment of the invention.

Figure 5:
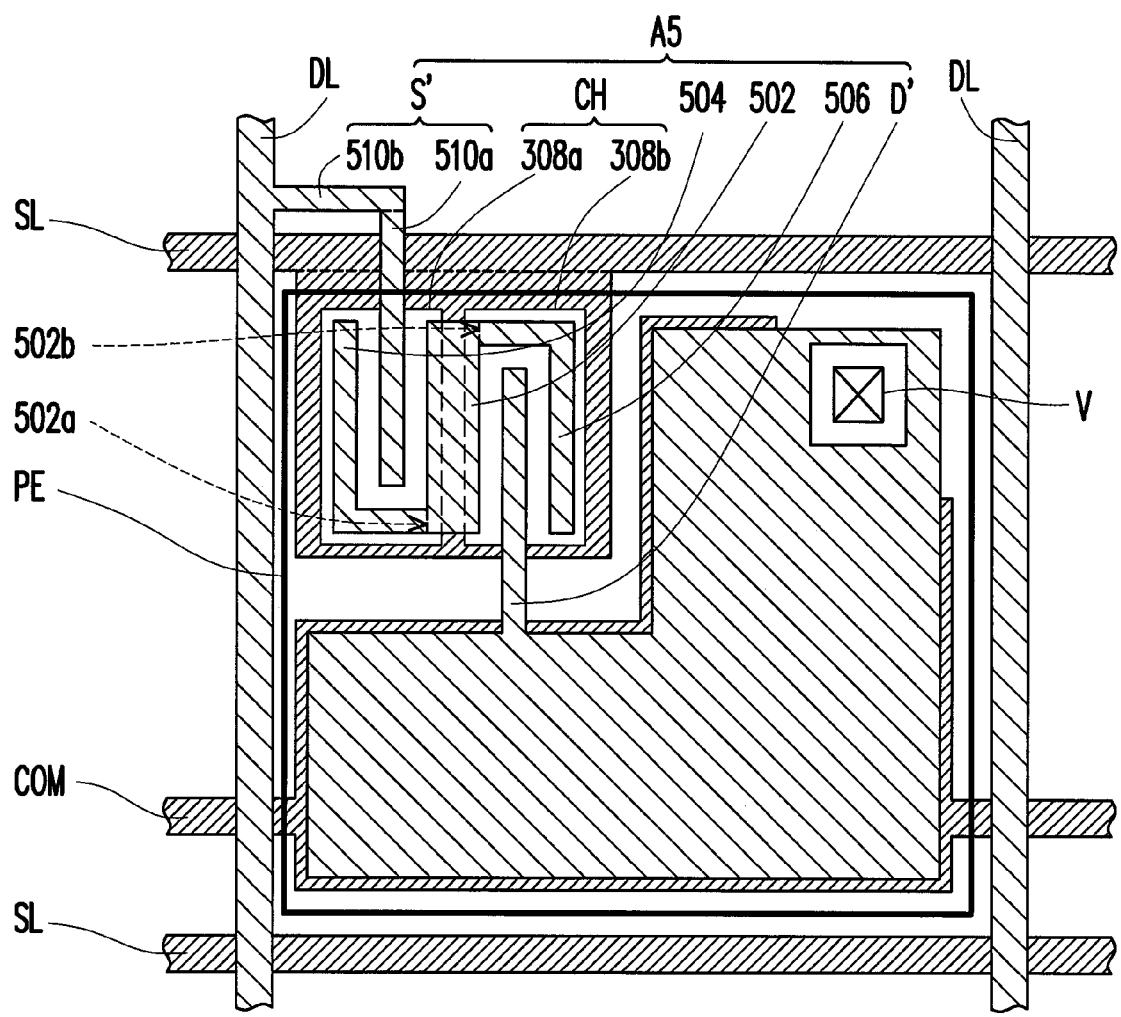
FIG. 5 is a schematic top view illustrating a pixel structure according to another embodiment of the invention.

It should be mentioned that the extension directions of the source electrode S, the drain electrode D, and the connection electrode 302 are substantially parallel to the directions of the scan lines SL in the previous two embodiments, which should however not be construed as a limitation to the invention. In other embodiments of the invention, the extension directions of the source electrode, the drain electrode, and the connection electrode are not necessarily parallel to the direction of the scan line, as depicted in FIG. 5. FIG. 5 is a schematic top view illustrating a pixel structure according to another embodiment of the invention. Note that identical elements in FIG. 5 and FIG. 3A are represented by the same reference numbers. Therefore, detailed descriptions thereof are not repeated hereinafter.

The main components of the pixel structure shown in FIG. 5 are substantially the same as the main components of the pixel structure shown in FIG. 3A, while the difference therebetween mainly lies in the extension directions of the source electrode S', the drain electrode D', and the connection electrode 502. Here, the extension directions of the source electrode S', the drain electrode D', and the connection electrode 502 are substantially the same. For instance, the extension directions of the source electrode S', the drain electrode D', and the connection electrode 502 are substantially parallel to directions of the data lines DL. According to this embodiment, the source electrode S' includes a main portion 510a and a connection portion 510b. The main portion 510a is connected to the connection portion 510b, and the connection portion 510b is connected to the data line DL. Specifically, the extension direction of the main portion 510a of the source electrode S' is substantially parallel to the extension directions of the data lines DL, and the extension direction of the connection portion 510b of the source electrode S' is substantially parallel to the extension directions of the scan lines SL. In each of the pixel structures, the main portion 510a of the source electrode S' is extended from the connection portion 510b to the gate electrode G. In a modified embodiment, the gate electrode G can refer to one gate electrode or two gate electrodes respectively corresponding to the first and second channel pattern layers 308a and 308b.

In this embodiment, the first branch portion 504 is connected to one end 502a of the connection electrode 502 to form a U-shaped pattern that surrounds the source electrode S; the second branch portion 506 is connected to the other end 502b of the connection electrode 502 to form another U-shaped pattern that surrounds the drain electrode D'. As indicated in FIG. 5, the connection electrode 502, the first branch portion 504, and the second branch portion 506 are collectively shaped as a letter S, i.e. an S shaped pattern. When the design is applied to the active device A5, the layout area of the active device A5 can be reduced, so as to increase the storage capacitance of the storage capacitor Cst, promote the device performance, and improve the display quality of images.

It should be mentioned that other embodiments in addition to the above-mentioned ones are applicable in the invention. According to the previous embodiments, the connection electrode, the first branch portion, and the second branch portion are collectively shaped as a letter S, which should not be construed as a limitation to the invention. In other embodiments of the invention, the connection electrode, the first branch portion, and the second branch portion can also be shaped in another manner, which will be described hereinafter.

Figure 6:
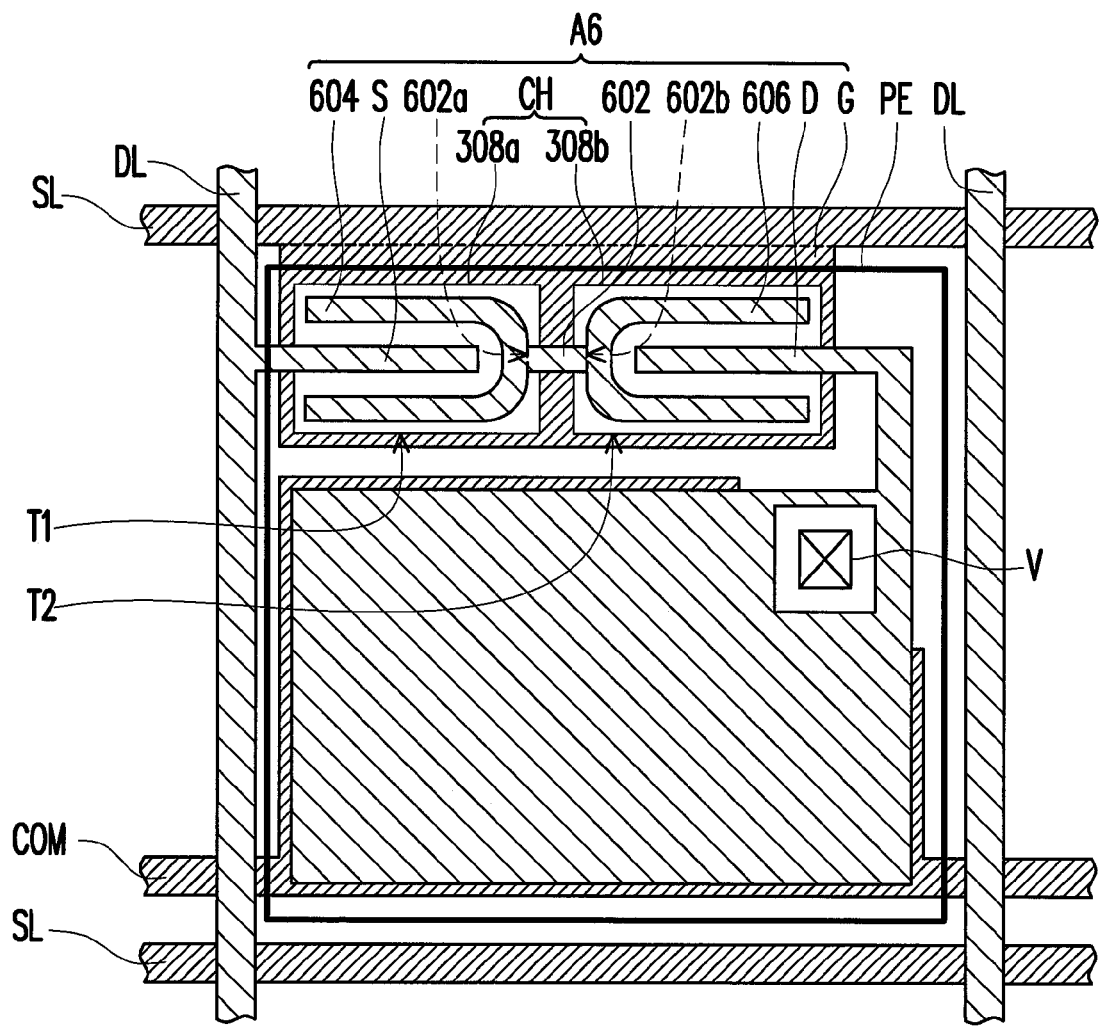
FIG. 6 is a schematic top view illustrating a pixel structure according to another embodiment of the invention.

FIG. 6 is a schematic top view illustrating a pixel structure according to another embodiment of the invention. Note that identical elements in FIG. 6 and FIG. 3A are represented by the same reference numbers. Therefore, detailed descriptions thereof are not repeated hereinafter.

The main components of the pixel structure shown in FIG. 6 are substantially the same as the main components of the pixel structure shown in FIG. 3A, while the difference therebetween mainly lies in that the connection electrode 602, the first branch portion 604, and the second branch portion 606 are collectively shaped as a letter X, i.e. an X shaped pattern. For instance, the first branch portion 604 and the second branch portion 606 are respectively shaped as a letter U, and the opening of the U-shaped first branch portion 604 and the opening of the U-shaped second branch portion 606 respectively face two opposite sides, so as to individually surround the source electrode S and the drain electrode D. The extension directions of the source electrode D, and the connection electrode 602 between the source electrode S and the drain electrode D are substantially parallel to the directions of the scan lines SL. The first branch portion 604 is connected to one end 602a of the connection electrode 602, and the second branch portion 606 is connected to the other end 602b of the connection electrode 602. The two U-shaped first and second branch portions 604 and 606 are connected to form the X-shaped pattern by the connection electrode 602.

Figure 7:
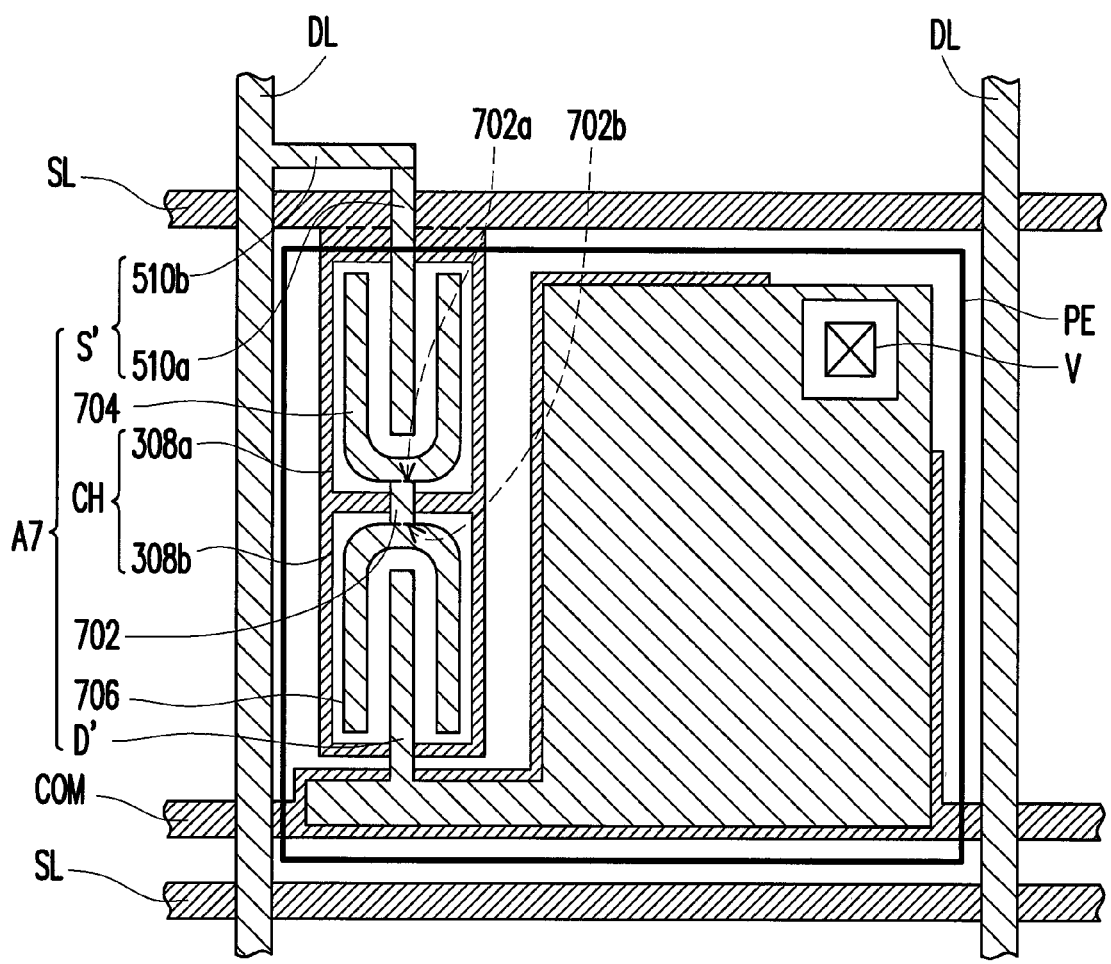
FIG. 7 is a schematic top view illustrating a pixel structure according to another embodiment of the invention.

FIG. 7 is a schematic top view illustrating a pixel structure according to another embodiment of the invention. Note that identical elements in FIG. 7 and FIG. 5 are represented by the same reference numbers. Therefore, detailed descriptions thereof are not repeated hereinafter.

The main components of the pixel structure shown in FIG. 7 are substantially the same as the main components of the pixel structure shown in FIG. 5, while the difference therebetween mainly lies in that the connection electrode 702, the first branch portion 704, and the second branch portion 706 are collectively shaped as a letter X. The first branch portion 704 and the second branch portion 706 are respectively shaped as a letter U, and the opening of the U-shaped first branch portion 704 and the opening of the U-shaped second branch portion 706 respectively face two opposite sides, so as to individually surround the source electrode S' and the drain electrode D'. The extension directions of the source electrode S', the drain electrode D', and the connection electrode 702 between the source electrode S' and the drain electrode D' are substantially parallel to the directions of the data lines DL. The U-shaped first branch portion 704 is connected to one end 702a of the connection electrode 702, and the U-shaped second branch portion 706 is connected to the other end 702b of the connection electrode 702, so as to form the X-shaped pattern.

Figure 8:
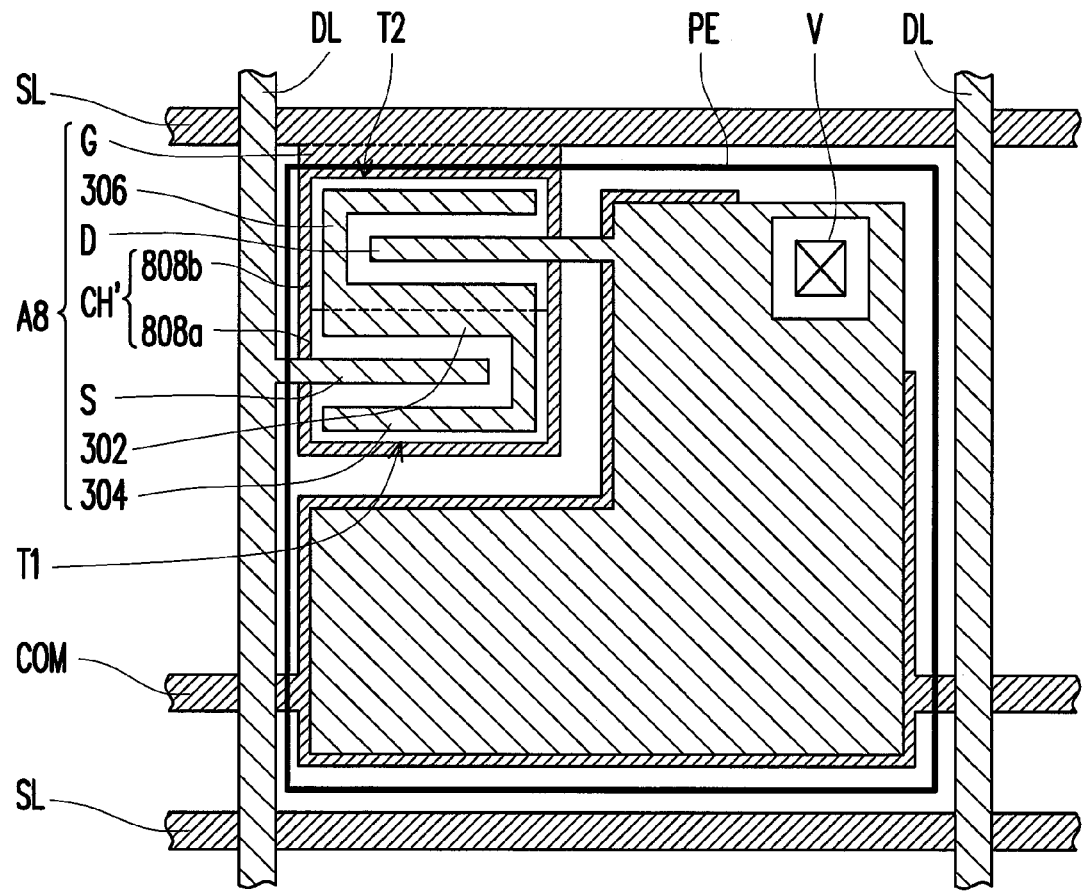
FIG. 8 is a schematic top view illustrating a pixel structure according to another embodiment of the invention.

In the pixel structure respectively shown in FIG. 7 and FIG. 8, the connection electrode, the first branch portion, and the second branch portion are collectively shaped as a letter X, so as to surround the source electrode and the drain electrode, respectively. Therefore, the layout area can be reduced while the W/L ratio of channel remains high, and the process tolerance can be promoted.

The components of the channel layer are not limited in other embodiments of the invention. If applicable, the channel layer is not necessarily constituted by the first and second channel pattern layers. FIG. 8 is a schematic top view illustrating a pixel structure according to an embodiment of the invention. Note that identical elements in FIG. 8 and FIG. 3A are represented by the same reference numbers. Therefore, detailed descriptions thereof are not repeated hereinafter.

The main components of the pixel structure shown in FIG. 8 are substantially the same as the main components of the pixel structure shown in FIG. 3A, while the difference therebetween mainly lies in that the channel layer CH' has a continuous pattern. In this embodiment, the channel layer CH' includes a first channel portion 808a and a second channel portion 808b. The source electrode S, the connection electrode 302, and the first branch portion 304 are respectively located on a portion of the first channel portion 808a, and the drain electrode D, the connection electrode 302, and the second branch 306 are respectively located on a portion of the second channel portion 808b. Hence, in the pixel structure described in this embodiment, the layout area of the active device A8 can be reduced while the conductive current Ion stays high and the amount of current leakage remains negligible. Thereby, the storage capacitance of the storage capacitor Cst can be increased, and the device performance can be promoted.

In the embodiments shown in FIG. 5 to FIG. 7, the channel layer respectively in the active devices A5, A6, and A7 may not constitute two channel pattern layers. Namely, the channel layer respectively in the active devices A5, A6, and A7 can be replaced by the channel layer CH' having the continuous pattern, as indicated in FIG. 8.

Figure 9:
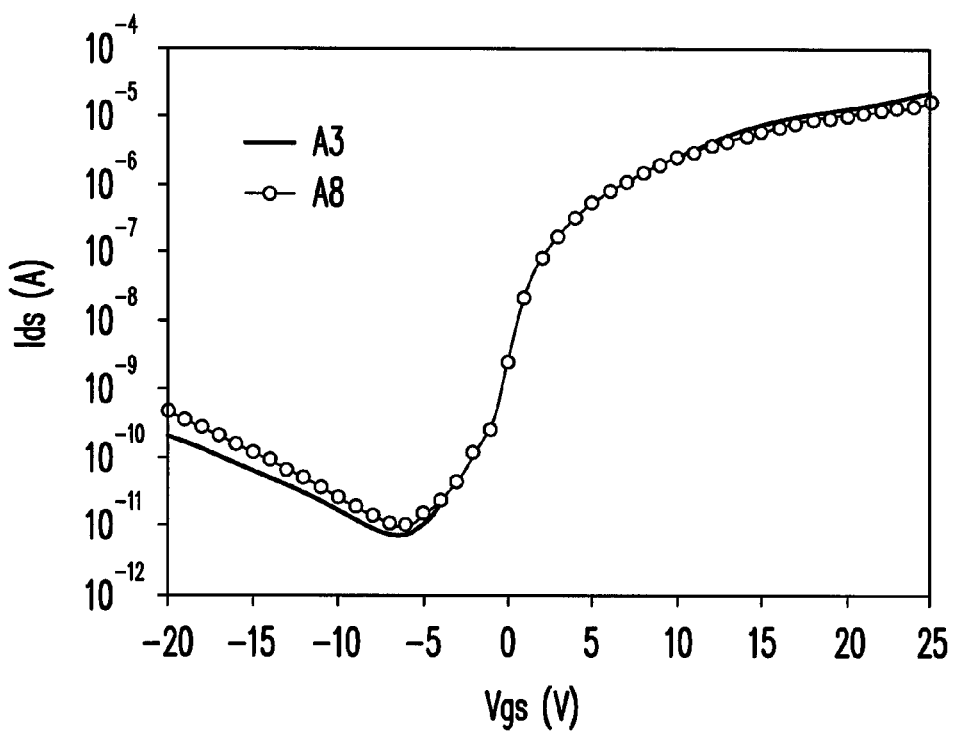
FIG. 9 is a graph illustrating the current and voltage (I-V) correlation between the active device A3 of the pixel structure shown in FIG. 3A and the active device A8 of the pixel structure shown in FIG. 8 on the condition that a source-drain voltage Vds is approximately 30 V.

FIG. 9 is a graph illustrating the current and voltage (I-V) correlation between the active device A3 of the pixel structure shown in FIG. 3A and the active device A8 of the pixel structure shown in FIG. 8 on the condition that a source-drain voltage Vds is approximately 30 V. In FIG. 9, the x-axis represents the gate-source voltage Vgs, and the y-axis represents the drain-source current Ids. As shown in FIG. 9, when the active device A3 depicted in FIG. 3A and the active device A8 depicted in FIG. 8 are turned on, the drain-source current Ids in the two active devices A3 and A8 is similar, which indicates the two active devices A3 and A8, if individually acting as the switch device of the pixel structure, may have similar pixel-retaining capability.

In the pixel structures described in the previous embodiments of the invention, the scan lines SL have certain segments with the relatively large width, and these segments exemplarily serve as the gate electrodes G. Nonetheless, the invention is not limited thereto. According to other embodiments of the invention, the line width of the scan line remains consistent, and a portion of the sufficiently wide scan line in the pixel structure of this invention can also act as the gate electrode G. Since people having ordinary skill in the art should be aware of the modifications and applications based on the previous embodiments, such modifications and applications are not described hereinafter.

In light of the foregoing, the pixel structure, the active device array substrate, and the flat display panel described in the embodiments of the invention at least have the following advantages.

The symmetric S-shaped or X-shaped dual-gate design is applied in the pixel structure of the invention, which contributes to the reduction of the layout area of the active device while the W/L ratio of the channel remains high. Accordingly, by applying the design of the pixel structure, as compared with that of the conventional pixel structure, the storage capacitance of the storage capacitor Cst can be increased, and satisfactory performance of devices can be guaranteed.

Since the connection electrode, the first branch portion, and the second branch portion are collectively shaped as a letter S or a letter X in the invention, the process tolerance can be further increased. Thereby, the PEP shift barely causes the asymmetric gate-to-drain capacitance Cgd, such that the display images are less likely to flicker, and that the image quality can be improved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A pixel structure electrically connected to a scan line and a data line, the pixel structure comprising:
   a pixel electrode; and
   an active device comprising:
      a gate electrode electrically connected to the scan line;
      a channel layer located at one side of the gate electrode and electrically insulated from the gate electrode;
      a source electrode electrically connected to the data line;
      a drain electrode electrically connected to the pixel electrode;
      a connection electrode, wherein the source electrode, the drain electrode, and the connection electrode are located on a portion of the channel layer, and the connection electrode is located between the source electrode and the drain electrode;
      a first branch portion located on a portion of the channel layer and connected to one end of the connection electrode, the first branch portion surrounding the source electrode located on the channel layer; and
      a second branch portion located on a portion of the channel layer and connected to the other end of the connection electrode, the second branch portion surrounding the drain electrode on the channel layer.

2. The pixel structure as recited in claim 1, wherein the pixel electrode comprises a reflective electrode, a transmissive electrode, or a transflective electrode.

3. The pixel structure as recited in claim 1, further comprising a gate dielectric layer located between the channel layer and the gate electrode.

4. The pixel structure as recited in claim 1, wherein the channel layer comprises a first channel pattern layer and a second channel pattern layer, and wherein the source electrode, the connection electrode and the first branch portion are respectively located on a portion of the first channel pattern layer, and the drain electrode, the connection electrode and the second branch portion are respectively located on a portion of the second channel pattern layer.

5. The pixel structure as recited in claim 4, wherein the gate electrode, the first channel pattern layer, the source electrode, the connection electrode and the first branch portion together constitute a first transistor, and the gate electrode, the second channel pattern layer, the drain electrode, the connection electrode and the second branch portion together constitute a second transistor.

6. The pixel structure as recited in claim 1, wherein the connection electrode and the first branch portion collectively have a U shaped pattern.

7. The pixel structure as recited in claim 1, wherein the connection electrode and the second branch portion collectively have a U shaped pattern.

8. The pixel structure as recited in claim 1, wherein the connection electrode, the first branch portion, and the second branch portion collectively have an S shaped pattern.

9. The pixel structure as recited in claim 1, wherein the connection electrode, the first branch portion, and the second branch portion collectively have an X shaped pattern.

10. The pixel structure as recited in claim 1, wherein extension directions of the source electrode, the drain electrode, and the connection electrode are substantially the same.

11. The pixel structure as recited in claim 1, wherein extension directions of the source electrode, the drain electrode, and the connection electrode are substantially parallel to a direction of the scan line.

12. The pixel structure as recited in claim 1, further comprising a common electrode configured below the pixel electrode.

13. The pixel structure as recited in claim 1, wherein the gate electrode is a segment of the scan line.

14. The pixel structure as recited in claim 1, wherein extension directions of the source electrode, the drain electrode, and the connection electrode are substantially parallel to a direction of the data line.

15. The pixel structure as recited in claim 1, wherein the channel layer has a continuous pattern.

16. The pixel structure as recited in claim 15, wherein the channel layer comprises a first channel portion and a second channel portion, the source electrode, the connection electrode, and the first branch portion are respectively located on a portion of the first channel portion, and the drain electrode, the connection electrode, and the second branch portion are respectively located on a portion of the second channel portion.

17. An active device array substrate comprising:
a substrate;
a plurality of scan lines configured on the substrate in parallel;
a plurality of data lines configured on the substrate in parallel and intersecting the scan lines;
a plurality of pixel structures located on the substrate, each of the pixel structures being electrically connected to a corresponding one of the scan lines and a corresponding one of the data lines and comprising:
a pixel electrode; and
an active device comprising:
   a gate electrode electrically connected to the corresponding one of the scan lines;
   a channel layer located at one side of the gate electrode and electrically insulated from the gate electrode;
   a source electrode electrically connected to the corresponding one of the data lines;
   a drain electrode electrically connected to the pixel electrode;
   a connection electrode, wherein the source electrode, the drain electrode, and the connection electrode are located on a portion of the channel layer, and the connection electrode is located between the source electrode and the drain electrode;
   a first branch portion located on a portion of the channel layer and connected to one end of the connection electrode, the first branch portion surrounding the source electrode located on the channel layer; and
   a second branch portion located on a portion of the channel layer and connected to the other end of the connection electrode, the second branch portion surrounding the drain electrode on the channel layer.

18. A flat display panel comprising:
a first substrate and a second substrate;
a display medium located between the first substrate and the second substrate;
a plurality of scan lines configured on the first substrate in parallel;
a plurality of data lines configured on the first substrate in parallel and intersecting the scan lines;
a plurality of pixel structures located on the first substrate, each of the pixel structures being electrically connected to a corresponding one of the scan lines and a corresponding one of the data lines and comprising:
a pixel electrode; and
an active device comprising:
   a gate electrode electrically connected to the scan line;
   a channel layer located at one side of the gate electrode and electrically insulated from the gate electrode;
   a source electrode electrically connected to the corresponding one of the data lines;
   a drain electrode electrically connected to the pixel electrode;
   a connection electrode, wherein the source electrode, the drain electrode, and the connection electrode are located on a portion of the channel layer, and the connection electrode is located between the source electrode and the drain electrode;
   a first branch portion located on a portion of the channel layer and connected to one end of the connection electrode, the first branch portion surrounding the source electrode located on the channel layer; and
   a second branch portion located on a portion of the channel layer and connected to the other end of the connection electrode, the second branch portion surrounding the drain electrode on the channel layer.

19. The flat display panel as recited in claim 18, wherein the display medium comprises an electro-phoretic display film, an organic electroluminescent layer, or a liquid crystal layer.

20. The flat display panel as recited in claim 19, wherein the electro-phoretic display film comprises a microcup electro-phoretic display film or a microcapsule electro-phoretic display film.

21. The flat display panel as recited in claim 20, wherein the second substrate further comprises an opposite electrode.

* * * * *